United States Patent
Poplevine et al.

(10) Patent No.: US 7,020,027 B1
(45) Date of Patent: *Mar. 28, 2006

(54) PROGRAMMING METHOD FOR NONVOLATILE MEMORY CELL

(75) Inventors: Pavel Poplevine, Foster City, CA (US); Yuri Mirgorodski, Sunnyvale, CA (US); Andrew J. Franklin, Santa Clara, CA (US); Peter J. Hopper, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 8 days.

This patent is subject to a terminal disclaimer.

(21) Appl. No.: 10/895,712

(22) Filed: Jul. 8, 2004

(51) Int. Cl.
G11C 16/04 (2006.01)

(52) U.S. Cl. .................... 365/185.28; 365/185.05; 365/185.14; 365/185.2

(58) Field of Classification Search .......... 365/185.05, 365/185.1, 185.14, 185.2, 185.28
See application file for complete search history.

(56) References Cited

U.S. PATENT DOCUMENTS

| 4,228,527 A | * | 10/1980 | Gerber et al. | 365/185.08 |
| 5,364,806 A | * | 11/1994 | Ma et al. | 438/266 |
| 5,686,332 A | * | 11/1997 | Hong | 438/261 |
| 6,324,095 B1 | * | 11/2001 | McPartland et al. | 365/185.05 |

OTHER PUBLICATIONS

U.S. Appl. No. 10/664,469, filed Sep. 17, 2003.
U.S. Appl. No. 10/665,185, filed Sep. 17, 2003.
U.S. Appl. No. 10/895,711, filed Jul. 8, 2004.
U.S. Appl. No. 10/895,713, filed Jul. 8, 2004.
U.S. Appl. No. 10/895,710, filed Jul. 8, 2004.

* cited by examiner

*Primary Examiner*—Hoai Ho
(74) *Attorney, Agent, or Firm*—Vedder Price Kaufman & Kammholz P.C.

(57) ABSTRACT

A method of programming a nonvolatile memory cell in which a ramped control voltage is used to obtain the desired voltage on the storage node.

5 Claims, 5 Drawing Sheets

PROGRAMMING METHOD FOR NONVOLATILE MEMORY CELL

BACKGROUND OF THE INVENTION

1. Field of the Invention

The present invention relates to nonvolatile memory (NVM) cells, and in particular to programming methods for NVM cells.

2. Description of the Related Art

Conventional programming methods for NVM cells based upon P-channel insulated gate field effect transistors (P-IGFETs), such as P-type metal oxide semiconductor field effect transistors (P-MOSFETs), are based upon hot electron injection occurring (with the source electrode grounded) at large negative drain electrode potentials of approximately −5 volts along with a negative gate electrode potential. The injection current has a maximum magnitude with respect to the gate electrode voltage and is smaller at low and large negative gate voltages. Conventional methods bring the floating gate voltage to a low negative value, at which the electron injection begins and produces an increasingly negative value of floating gate voltage, which in turn, produces more electron injections, and so on. This self-supporting mechanism ceases, however, when the floating gate voltage has passed through its maximum value to a negative value where the electron injection becomes negligible. This programming effect is equal to the width of the gate voltage zone where injection is non-negligible, depends on drain voltage, and, as such, is limited (e.g., approximately 2.5 volts).

SUMMARY OF THE INVENTION

In accordance with the presently claimed invention, a method of programming a nonvolatile memory cell uses a ramped control voltage to obtain the desired voltage on the storage node.

In accordance with one embodiment of the presently claimed invention, a method of programming a memory cell with a plurality of P-channel insulated gate field effect transistors (P-IGFETs), each having a gate, a drain, a source and an N-well, and including a control P-IGFET with a control electrode connecting its drain, source and N-well, a write P-IGFET with a write electrode connecting its source and N-well, a read P-IGFET with a read electrode connecting its source and N-well, an erase P-IGFET with an erase electrode connecting its drain, source and N-well, and a shared electrode connecting the control, write, read and erase P-IGFET gates, includes:
  applying a substantially fixed reference voltage to the control electrode, the write P-IGFET drain, the write electrode, the read P-IGFET drain, the read electrode and the erase electrode;
  applying to the write electrode a substantially fixed programming voltage which is more positive than the reference voltage; and
  applying to the control electrode a variable voltage having a magnitude which is approximately ramped from the reference voltage to a predetermined voltage which is more positive than the reference voltage.

In accordance with another embodiment of the presently claimed invention, a method of programming a memory cell with a plurality of P-channel insulated gate field effect transistors (P-IGFETs), each having a gate, a drain, a source and an N-well, and including a control capacitor with first and second electrodes, a write P-IGFET with a write electrode connecting its source and N-well, a read P-IGFET with a read electrode connecting its source and N-well, an erase P-IGFET with an erase electrode connecting its drain, source and N-well, and a shared electrode connecting the first control capacitor electrode and the write, read and erase P-IGFET gates, includes:
  applying a substantially fixed reference voltage to the second control capacitor electrode, the write P-IGFET drain, the write electrode, the read P-IGFET drain, the read electrode and the erase electrode;
  applying to the write electrode a substantially fixed programming voltage which is more positive than the reference voltage; and
  applying to the second control capacitor electrode a variable voltage having a magnitude which is approximately ramped from the reference voltage to a predetermined voltage which is more positive than the reference voltage.

In accordance with still another embodiment of the presently claimed invention, a method of programming a memory cell with a plurality of P-channel insulated gate field effect transistors (P-IGFETs), each having a gate, a drain, a source and an N-well, and including a gated diode with a gate, an anode and a cathode, a control P-IGFET with a control electrode connecting its drain, source and N-well, a read P-IGFET with a read electrode connecting its source and N-well, an erase P-IGFET with an erase electrode connecting its drain, source and N-well, and a shared electrode connecting the gated diode gate and the control, read and erase P-IGFET gates, includes:
  applying a substantially fixed reference voltage to the control electrode, the gated diode anode, the gated diode cathode, the read P-IGFET drain, the read electrode and the erase electrode;
  applying to the gated diode anode a substantially fixed programming voltage which is more positive than the reference voltage; and
  applying to the control electrode a variable voltage having a magnitude which is approximately ramped from the reference voltage to a predetermined voltage which is more positive than the reference voltage.

In accordance with still another embodiment of the presently claimed invention, a method of programming a memory cell with a plurality of P-channel insulated gate field effect transistors (P-IGFETs), each having a gate, a drain, a source and an N-well, and including a control capacitor with first and second electrodes, a gated diode with a gate, an anode and a cathode, a read P-IGFET with a read electrode connecting its source and N-well, an erase P-IGFET with an erase electrode connecting its drain, source and N-well, and a shared electrode connecting the first control capacitor electrode, the gated diode gate, and the read and erase P-IGFET gates, includes:
  applying a substantially fixed reference voltage to the second control capacitor electrode, the gated diode anode, the gated diode cathode, the read P-IGFET drain, the read electrode and the erase electrode;
  applying to the gated diode anode a substantially fixed programming voltage which is more positive than the reference voltage; and
  applying to the second control capacitor electrode a variable voltage having a magnitude which is approximately ramped from the reference voltage to a predetermined voltage which is more positive than the reference voltage.

In accordance with still another embodiment of the presently claimed invention, a method of programming a stacked gate memory cell that includes spaced apart P-type diffusion regions formed in an N-type semiconductor substrate to define drain and source regions with a substrate channel region therebetween, a conductive floating gate electrode formed over the channel region and separated therefrom by gate dielectric material, and a conductive control gate electrode formed over the floating gate electrode and separated therefrom by an intergate dielectric material, includes:

applying a substantially fixed reference voltage to the control gate electrode, the drain region and the source region;

applying to the source region a substantially fixed programming voltage which is more positive than the reference voltage; and applying to the control gate electrode a variable voltage having a magnitude which is approximately ramped from the reference voltage to a predetermined voltage which is more positive than the reference voltage.

DETAILED DESCRIPTION

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alpha, numeric or alphanumeric designators.

As discussed in more detail below, a method for programming NVM cells in accordance with the presently claimed invention brings the floating gate potential to a negative value below the programming zone, following which the gate voltage is increased in an at least approximately ramped manner. Coupling between the control gate and the floating gate causes the floating gate potential to rise in the programming zone until electron injection current compensates the effect of such coupling. At this point, the floating gate potential may stay as long as the control gate ramps up (e.g., "surfing") on the wave of injection current, with the programming effect limited only by how much control voltage is available. A related programming method is discussed in U.S. patent application Ser. No. 10/664,469, filed on Sep. 17, 2003, the disclosure of which is incorporated herein by reference.

Figure 1:
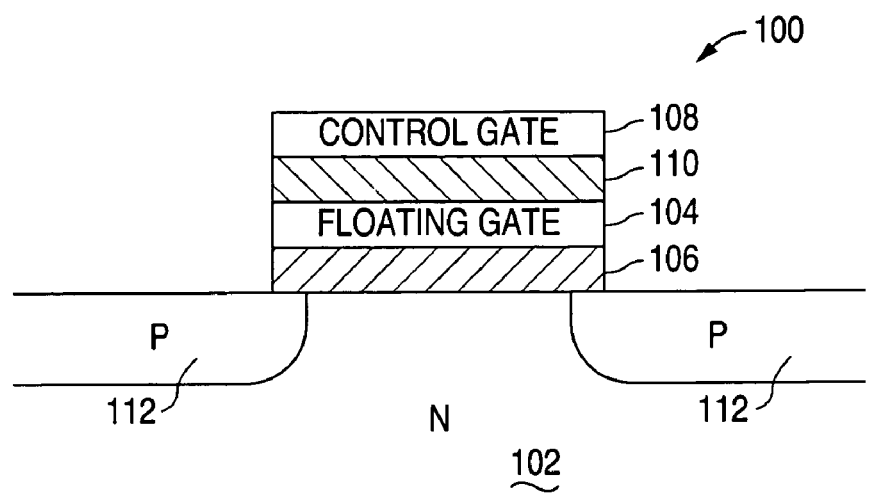
FIG. 1 is a partial cross sectional view of a conventional P-channel insulated gate field effect transistor (P-IGFET) stacked gate NVM cell.

Referring to FIG. 1, a conventional P-IGFET (e.g., P-channel metal oxide semiconductor field effect transistor, or P-MOSFET) stacked gate NVM cell 100 is formed in an N-type region 102 of semiconductor material (e.g., crystalline silicon). As is well known, such N-type region 102 is typically an N-well formed in a P-type silicon substrate. The cell 100 includes a conductive floating gate 104 (e.g., polysilicon) that is separated from the N-type region 102 by a layer of thin gate dielectric material 106 (e.g., silicon dioxide). A control gate electrode 108 (e.g., polysilicon) is separated from the floating gate 104 by a layer of intergate dielectric material 110 (e.g., a sandwich of oxide-nitride-oxide). Two P-type diffusion regions 112 formed at the sides of the stacked gate structure provide the source and drain regions of the cell 100 and define an N-type channel region between them. Fabrication techniques available for making such cells 100 are well known.

As is well known, such a cell uses hot electron injection in a conventional method of programming NVM cells. When applied to such a stacked gate cell 100, the hot electron injection programming method assumes that a high negative voltage is applied to the drain region of the cell 100. Depending upon the erasing and coupling coefficient(s), a corresponding voltage is applied to the control gate 108, thereby bringing the potential of the floating gate 104 to a value that is negative but lower in absolute value as compared with the drain potential. Under such conditions, a high lateral electrical field is generated, thereby creating hot electrons, which are affected by a high perpendicular electrical field such that the hot electrons tunnel through the thin gate oxide 106 to reach the floating gate 104. The amount of injection current depends primarily upon the potentials of the drain region and floating gate electrodes such that with more drain voltage more injection takes place. (Further discussion of such a memory cell and programming technique can be found in U.S. Pat. No. 6,137,723, the disclosure of which is incorporated herein by reference.)

Figure 2:
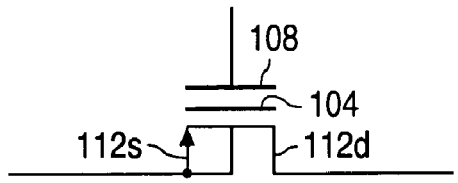
FIG. 2 is a schematic diagram for the NVM cell of FIG. 1.

Referring to FIG. 2, the memory cell 100 of FIG. 1 can be represented in electrical schematic form as shown.

Figure 3:
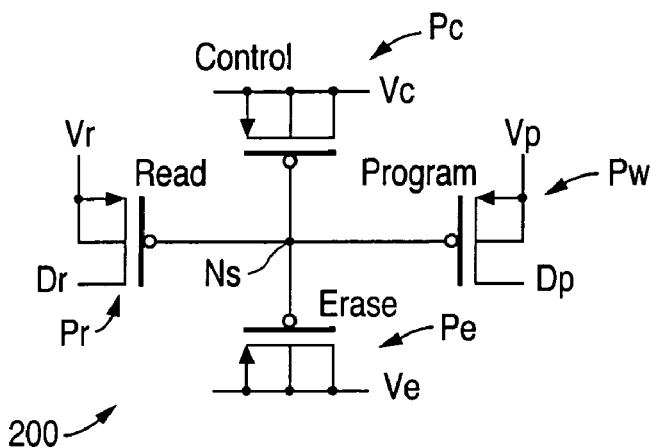
FIG. 3 is a schematic diagram of an alternative NVM cell.

Referring to FIG. 3, an alternative memory cell 200 includes four P-IGFETs, with one transistor for each of the cell functions (programs or write, read, erase and control). Such a cell 200, while being somewhat larger in size or circuit area than a conventional stacked gate cell within an integrated circuit environment, allows for independent and improved optimization of each cell function.

The program, or write, function is controlled by a transistor Pw with interconnected source and bulk regions to which a programming voltage Vp is applied, a drain region to which a programming signal Dp is applied, and a gate electrode connected to the storage node Ns. The read function is controlled by a transistor Pr having interconnected source and bulk regions to which a read voltage Vr is applied, a drain region from which a read signal Dr is received, and a gate electrode connected to the storage node Ns. The erase function is controlled by a transistor Pe having interconnected drain, source and bulk regions to which an erase voltage Ve is applied, and a gate electrode connected to the storage node Ns. The control function is controlled by a transistor Pc having interconnected drain, source and bulk regions to which a control voltage Vc is applied, and a gate electrode connected to the storage node Ns.

Programming such a memory cell 200 in a conventional manner would be as follows. During programming, or writing, a programming voltage Vp (e.g., approximately 5 volts) is applied, with all other electrodes being connected to the circuit reference potential (e.g., ground). During erasing, an erase voltage Ve is applied (e.g., approximately 10 volts), with all other electrodes connected to the circuit reference potential. During reading, a read voltage Vr is applied (e.g., approximately 1 volt), and all other electrodes are connected to the circuit reference potential. (Such voltages are typical for oxide thicknesses in the range of 60–80 Angstroms.)

Figure 4:
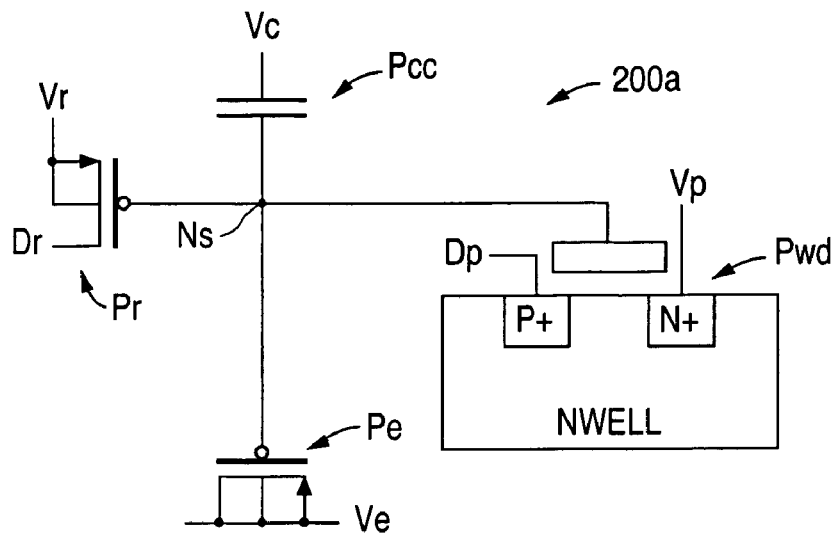
FIG. 4 is a schematic diagram of another alternative NVM cell.

Referring to FIG. 4, another alternative memory cell 200a is similar in design in that four separate devices are used for controlling the four respective functions (program, read, erase, control). However, as can be seen, the device Pcc used for the control function can be a capacitor instead of a transistor. Similarly, the programming, or writing, function can be controlled through the use of a gated diode Pwd instead of a transistor Pw. Hence, with reference to FIGS. 3 and 4, it can be seen that a memory cell in accordance with the presently claimed invention may include four transistors, three transistors and a capacitor, three transistors and a gated diode, or a combination of two transistors, a capacitor and a gated diode.

Figure 5:
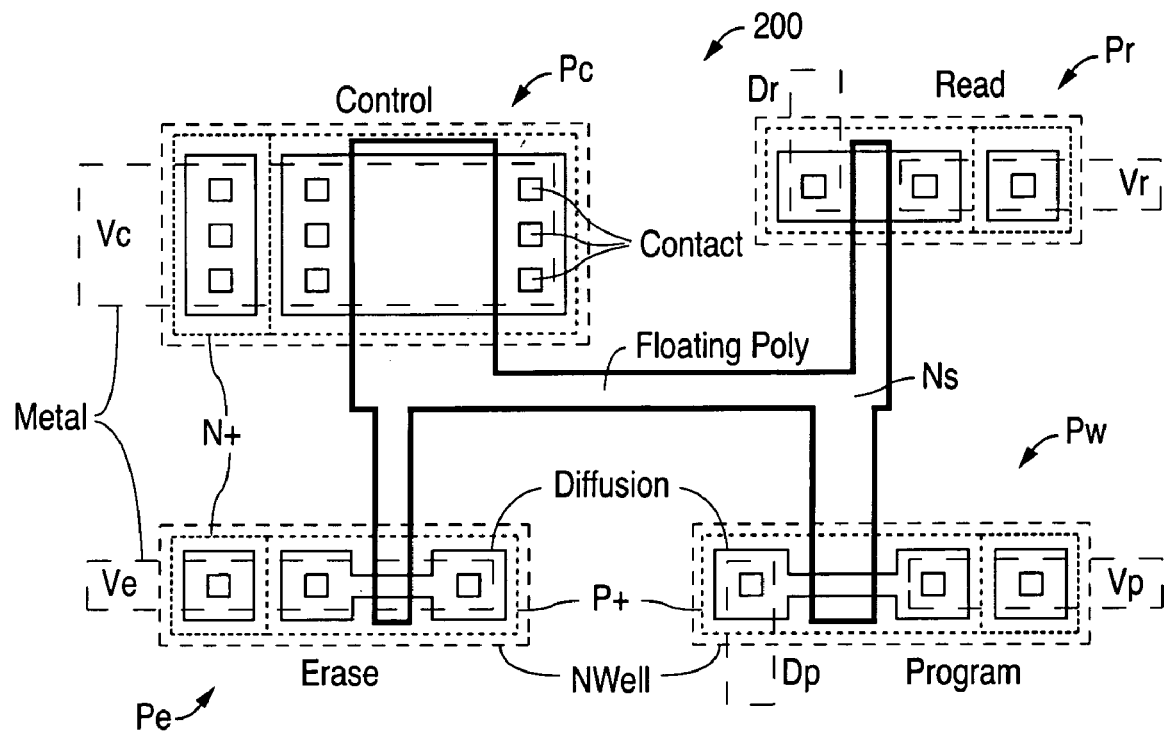
FIG. 5 is a plan view of a portion of an integrated circuit containing a NVM cell in conformance with the schematic diagram of FIG. 3.

Referring to FIG. 5, the design flexibility available with such a memory cell 200 can be better appreciated. For example, larger transistors can be used for the read function, thereby increasing the read signal current and speed. Conversely, a smaller transistor can be used for the programming, or writing, function, thereby reducing programming current and capacitance. Also, using an independent device for the control function allows different voltages to be used for the various functions, thereby allowing for optimization for each function.

Figure 6:
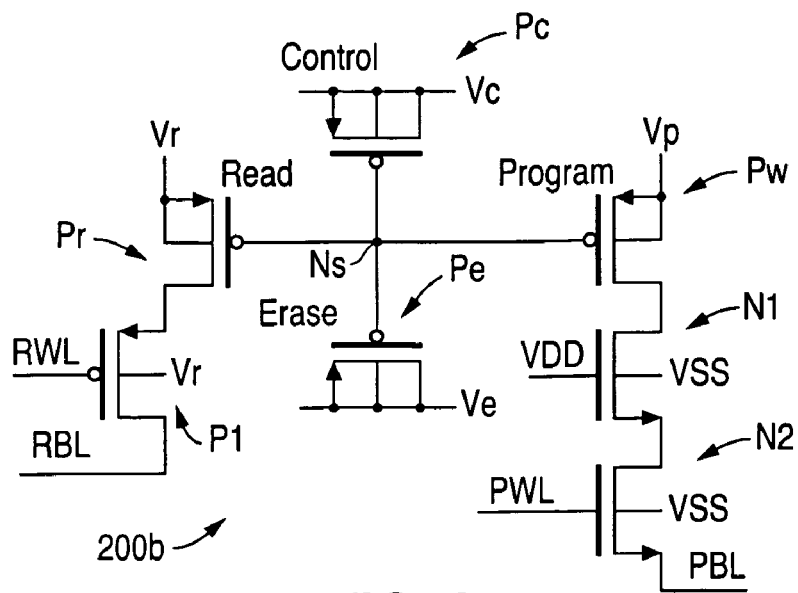
FIG. 6 is a schematic diagram of another alternative NVM cell.

Referring to FIG. 6, another alternative memory cell 200b includes additional transistors P1, N1, N2 for facilitating the use of such a memory cell 200b within an array of such cells. For example, to read data from the storage node Ns, a P-channel pass transistor P1 is used. To program data to the storage node Ns, a cascode circuit of two N-channel pass transistors N1, N2 is used to prevent a high voltage from appearing between a gate electrode and a drain or source region.

Figure 7:
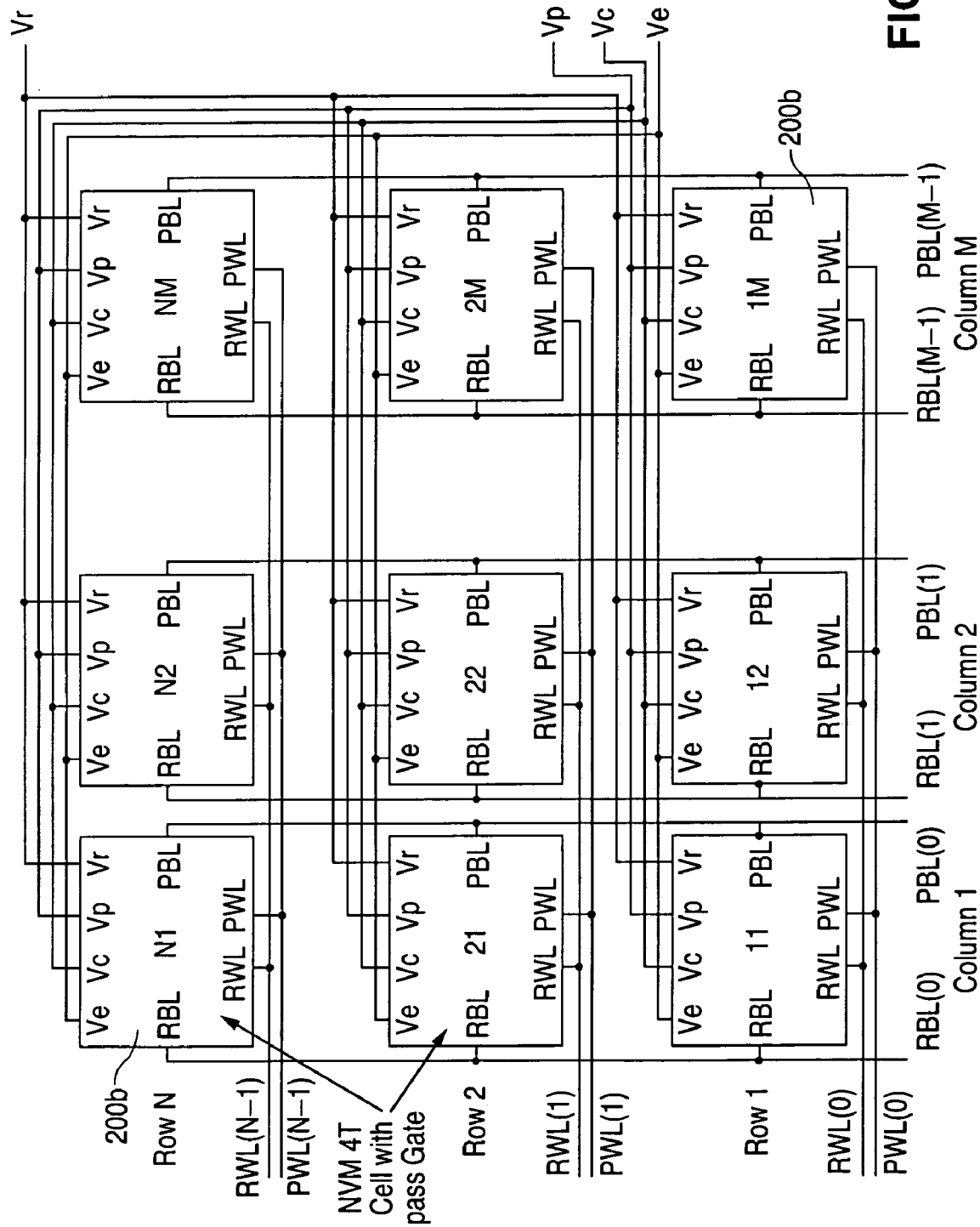
FIG. 7 is a functional block diagram of a NVM cell array composed of a plurality of NVM cells in conformance with the schematic diagram of FIG. 6.

Referring to FIG. 7, the memory cell 200b of FIG. 6 can be incorporated into an array as shown. Such an array has M columns and N rows. The program word line PWL selects the rows to be programmed, while the read word line RWL selects the rows to be read. The erase voltage Ve, program voltage Vp, control voltage Vc and read voltage Vr are applied to each cell directly. With no high voltage switches or other supporting circuitry, significantly simplified connections can be made from the external or internal voltage and signal sources and to the signal destinations.

The operational modes of erase, program and read are similar to those for a single cell. During erase mode, the program word lines PWL(0)–PWL(N−1) are at a logic low, the read word lines RWL(0)–RWL(N−1) are at a logic high, the erase voltage Ve is applied, and the rest of the signal lines are at circuit reference potential. This causes all cells to be erased.

During programming mode, the read word lines RWL(0)–RWL(N−1) are at a logic high, one of the program word lines, e.g., PWL(0), will be at a logic high while the remaining program word lines, e.g., PWL(1)–PWL(N−1), will be at a logic low. To program a particular cell 200b, the corresponding program bit line, e.g., PBL(0), will be at a logic low. To erase the remaining cells 200b, the corresponding program bit lines, e.g., PBL(1)–PBL(M−1), will be left floating. The program voltage Vp is applied to all cells 200b, while the remaining electrodes are at circuit reference potential.

During the read mode of operation, the program word lines PWL(0)–PWL(N−1) are at a logic low, one of the read word lines, e.g., RWL(0), will be at a logic low, while the remaining read word lines, e.g., RWL(1)–RWL(N−1) will be at a logic high. On each of the read bit lines RBL(0)–RBL(M−1) a high current or voltage will be received for each corresponding cell that had been programmed, while a low current or voltage will be received for each corresponding cell that had been erased. The read voltage Vr is applied to all cells 200b, while the remaining electrodes are at circuit reference potential.

Figure 8A:
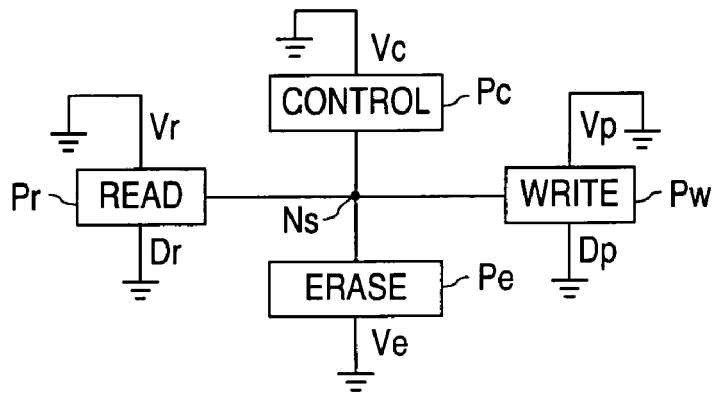
FIGS. 8A–8C illustrate a programming method in accordance with one embodiment of the presently claimed invention for NVM cells implemented in conformance with FIGS. 3 and 4.
Figure 8B:
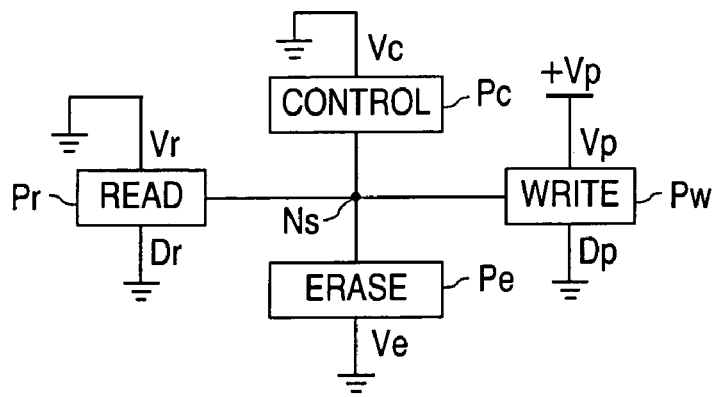
Figure 8C:
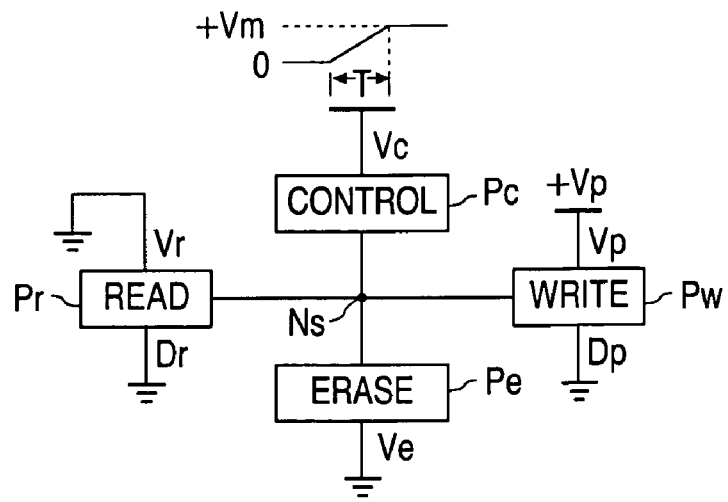

Referring to FIGS. 8A–8C, programming a four-device NVM cell (FIGS. 3 and 4) in accordance with one embodiment of the presently claimed invention is as follows. First, all electrodes of the control devices Pw, Pr, Pc, Pe are connected to the circuit reference potential, e.g., ground. Second, as shown in FIG. 8B, the write voltage electrode Vp of the write device Pw is driven by the positive programming voltage +Vp, while the other electrodes all remain at circuit reference potential. Third, as shown in FIG. 8C, while the write voltage terminal Vp of the write device Pw remains at the positive programming voltage +Vp, and the other electrodes remain at circuit reference potential, the control voltage electrode Vc is driven by a control voltage which is ramped from the circuit reference potential to a maximum voltage +Vm. The duration T of the ramped voltage should be sufficiently long to maintain a maximum value of injection current to the storage node Ns.

Figure 9A:
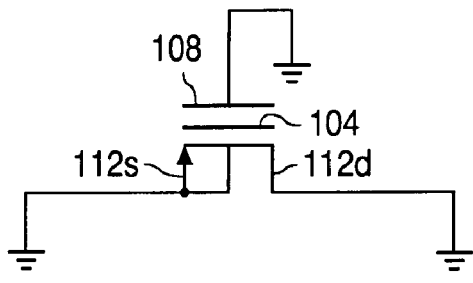
FIGS. 9A–9C illustrate a programming method in accordance with another embodiment of the presently claimed invention for use with NVM cells implemented in conformance with FIG. 2.
Figure 9B:
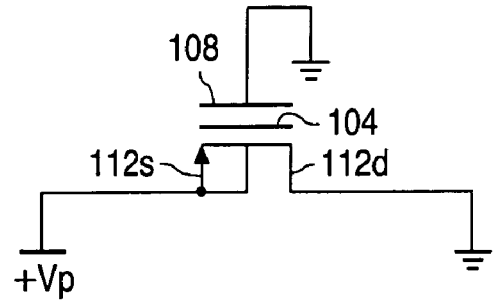
Figure 9C:
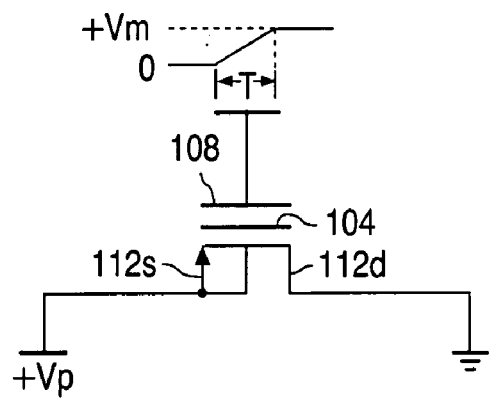

Referring to FIGS. 9A–9C, another method of programming a nonvolatile memory cell in accordance with another embodiment of the presently claimed invention for a conventional stacked gate cell is as follows. First, as shown in FIG. 9A, the drain region 112d, interconnected source and bulk regions 112s, and control gate 108 are connected to circuit reference potential, e.g., ground. Second, as shown in FIG. 9B, the interconnected source and bulk regions 112s are driven by the positive programming voltage +Vp, while the other electrodes 112d remain at circuit reference potential. Third, as shown in FIG. 9C, while the drain region 112d remains at circuit reference potential and the interconnected source and bulk regions 112s remain at the positive programming potential +Vp, the control gate 108 is driven by a voltage ramp as discussed above for FIG. 8C.

Based upon the foregoing, it should be understood that after the second programming step (FIGS. 8B and 9B), the potential at the storage node Ns and floating gate 104 is positive but lower than the source voltage by more than one width of the programming zone, thereby placing the cell in condition for programming.

With respect to the ramp voltage applied to the control electrode, two implementations are possible. In one implementation, the applied ramp voltage would be such that the control electrode voltage is more negative than that associated with the maximum injection current. This results in a higher current (e.g., drain current) through the write device Pw or drain region 112d. In another implementation, the ramp voltage is such that it is less negative than that associated with the maximum injection current. This results in lower write current, but requires a more complicated voltage ramp since the maximum voltage must first be applied to initiate the injection current.

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. A method of programming a memory cell with a plurality of P-channel insulated gate field effect transistors (P-IGFETs), each having a gate, a drain, a source and an N-well, and including a control P-IGFET with a control electrode connecting its drain, source and N-well, a write P-IGFET with a write electrode connecting its source and N-well, a read P-IGFET with a read electrode connecting its source and N-well, an erase P-IGFET with an erase electrode connecting its drain, source and N-well, and a shared electrode connecting said control, write, read and erase P-IGFET gates, said method comprising:

applying a substantially fixed reference voltage to said control electrode, said write P-IGFET drain, said write electrode, said read P-IGFET drain, said read electrode and said erase electrode;

applying to said write electrode a substantially fixed programming voltage which is more positive than said reference voltage; and applying to said control electrode a variable voltage having a magnitude which is approximately ramped from said reference voltage to a predetermined voltage which is more positive than said reference voltage.

2. A method of programming a memory cell with a plurality of P-channel insulated gate field effect transistors (P-IGFETs), each having a gate, a drain, a source and an N-well, and including a control capacitor with first and second electrodes, a write P-IGFET with a write electrode connecting its source and N-well, a read P-IGFET with a read electrode connecting its source and N-well, an erase P-IGFET with an erase electrode connecting its drain, source and N-well, and a shared electrode connecting said first control capacitor electrode and said write, read and erase P-IGFET gates, said method comprising:

applying a substantially fixed reference voltage to said second control capacitor electrode, said write P-IGFET drain, said write electrode, said read P-IGFET drain, said read electrode and said erase electrode;

applying to said write electrode a substantially fixed programming voltage which is more positive than said reference voltage; and applying to said second control capacitor electrode a variable voltage having a magnitude which is approximately ramped from said reference voltage to a predetermined voltage which is more positive than said reference voltage.

3. A method of programming a memory cell with a plurality of P-channel insulated gate field effect transistors (P-IGFETs), each having a gate, a drain, a source and an N-well, and including a gated diode with a gate, an anode and a cathode, a control P-IGFET with a control electrode connecting its drain, source and N-well, a read P-IGFET with a read electrode connecting its source and N-well, an erase P-IGFET with an erase electrode connecting its drain, source and N-well, and a shared electrode connecting said gated diode gate and said control, read and erase P-IGFET gates, said method comprising:

applying a substantially fixed reference voltage to said control electrode, said gated diode anode, said gated diode cathode, said read P-IGFET drain, said read electrode and said erase electrode;

applying to said gated diode anode a substantially fixed programming voltage which is more positive than said reference voltage; and applying to said control electrode a variable voltage having a magnitude which is approximately ramped from said reference voltage to a predetermined voltage which is more positive than said reference voltage.

4. A method of programming a memory cell with a plurality of P-channel insulated gate field effect transistors (P-IGFETs), each having a gate, a drain, a source and an N-well, and including a control capacitor with first and second electrodes, a gated diode with a gate, an anode and a cathode, a read P-IGFET with a read electrode connecting its source and N-well, an erase P-IGFET with an erase electrode connecting its drain, source and N-well, and a shared electrode connecting said first control capacitor electrode, said gated diode gate, and said read and erase P-IGFET gates, said method comprising:

applying a substantially fixed reference voltage to said second control capacitor electrode, said gated diode anode, said gated diode cathode, said read P-IGFET drain, said read electrode and said erase electrode;

applying to said gated diode anode a substantially fixed programming voltage which is more positive than said reference voltage; and applying to said second control capacitor electrode a variable voltage having a magnitude which is approximately ramped from said reference voltage to a predetermined voltage which is more positive than said reference voltage.

5. A method of programming a stacked gate memory cell that includes spaced apart P-type diffusion regions formed in an N-type semiconductor substrate to define drain and source regions with a substrate channel region therebetween, a conductive floating gate electrode formed over the channel region and separated therefrom by gate dielectric material, and a conductive control gate electrode formed over the floating gate electrode and separated therefrom by an intergate dielectric material, said method comprising:

applying a substantially fixed reference voltage to said control gate electrode, said drain region and said source region;

applying to said source region a substantially fixed programming voltage which is more positive than said reference voltage; and applying to said control gate electrode a variable voltage having a magnitude which is approximately ramped from said reference voltage to a predetermined voltage which is more positive than said reference voltage.

* * * * *